United States Patent
Heo et al.

(10) Patent No.: US 9,885,953 B2
(45) Date of Patent: *Feb. 6, 2018

(54) METHOD OF MANUFACTURING A MASK

(71) Applicant: SAMSUNG ELECTRONICS CO., LTD., Suwon-si, Gyeonggi-do (KR)

(72) Inventors: Jin-Seok Heo, Sunwon-si (KR); Chang-Min Park, Hwaseong-si (KR); Seok-Hwan Oh, Seoul (KR); Jeong-Ho Yeo, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 12 days.

This patent is subject to a terminal disclaimer.

(21) Appl. No.: 14/994,404

(22) Filed: Jan. 13, 2016

(65) Prior Publication Data

US 2016/0131970 A1 May 12, 2016

Related U.S. Application Data

(62) Division of application No. 13/440,112, filed on Apr. 5, 2012, now Pat. No. 9,256,124.

(30) Foreign Application Priority Data

Apr. 5, 2011 (KR) .......................... 10-2011-0030993

(51) Int. Cl.
*B29C 43/02* (2006.01)
*G03F 7/00* (2006.01)
(Continued)

(52) U.S. Cl.
CPC ........ *G03F 7/0002* (2013.01); *B29C 35/0805* (2013.01); *B82Y 10/00* (2013.01);
(Continued)

(58) Field of Classification Search
CPC ....... G03F 7/0002; B82Y 10/00; B82Y 40/00; B29C 35/0827; B29C 59/00; B29C 2059/023
(Continued)

(56) References Cited

U.S. PATENT DOCUMENTS 6,954,275 B2 10/2005 Choi et al.
7,229,273 B2 6/2007 Bailey et al.
(Continued)

FOREIGN PATENT DOCUMENTS

JP 2007-015375 A 1/2007
JP 2009-012290 A 1/2009
(Continued)

OTHER PUBLICATIONS

Office Action dated Sep. 26, 2017 from the Korean Intellectual Property Office (KIPO) for Korean Patent Application No. 10-2011-0030993.

*Primary Examiner* — Joseph S Del Sole
*Assistant Examiner* — Thukhanh T Nguyen
(74) *Attorney, Agent, or Firm* — Lee & Morse, P.C.

(57) ABSTRACT

A method of manufacturing a mask includes dividing an upper surface of a template having a design pattern into a plurality of regions, the template being arranged over a polymer layer on a mask substrate, correcting a distorted region among the regions, pressing the polymer layer with the template to form a mask pattern corresponding to the design pattern on the polymer layer; and curing the mask pattern.

9 Claims, 3 Drawing Sheets

(51) Int. Cl.
  *B82Y 10/00* (2011.01)
  *B82Y 40/00* (2011.01)
  *B29C 35/08* (2006.01)
  *B29L 31/00* (2006.01)

(52) U.S. Cl.
  CPC ...... *B82Y 40/00* (2013.01); *B29C 2035/0827* (2013.01); *B29L 2031/737* (2013.01)

(58) Field of Classification Search
  USPC .................. 425/174.4, 385, 406; 430/30
  See application file for complete search history.

(56) References Cited

U.S. PATENT DOCUMENTS

| | | |
|---|---|---|
| 7,744,358 B2 | 6/2010 | Kasono |
| 7,927,089 B2 | 4/2011 | Seki et al. |
| 2009/0061035 A1 | 3/2009 | Cho et al. |
| 2010/0104682 A1 | 4/2010 | Ando et al. |
| 2010/0109205 A1 | 5/2010 | Fletcher et al. |

FOREIGN PATENT DOCUMENTS

| | | |
|---|---|---|
| JP | 2009-060091 A | 3/2009 |
| JP | 2009-181617 A | 8/2009 |

METHOD OF MANUFACTURING A MASK

CROSS REFERENCE TO RELATED APPLCIATIONS

This is a divisional application based on pending application Ser. No. 13/440,112, filed Apr. 5, 2012, the entire contents of which is hereby incorporated by reference.

Korean Patent Application No. 10-2011-0030993, filed on Apr. 5, 2011, in the Korean Intellectual Property Office, and entitled: "Method of Manufacturing A Mask And Apparatus for Performing the Same," is incorporated by reference herein in its entirety.

BACKGROUND

1. Field

Example embodiments relate to a method of manufacturing a mask and an apparatus for performing the same. More particularly, example embodiments relate to a method of manufacturing a mask that may be used for forming a semiconductor pattern, and an apparatus for performing the method.

2. Description of the Related Art

Generally, a pattern may be formed by a process for forming a layer on a semiconductor substrate, a process for transcribing a mask pattern of a mask into the layer, etc.

The mask pattern may be formed by transcribing a design pattern into a polymer layer on a mask substrate. A template having the design pattern may press the polymer layer to engrave the design pattern on the polymer layer, thereby forming the mask pattern.

SUMMARY

According to an embodiment, there is provided a method of manufacturing a mask, the method including dividing an upper surface of a template having a design pattern into a plurality of regions, the template being arranged over a polymer layer on a mask substrate, correcting a distorted region among the regions, pressing the polymer layer with the template to form a mask pattern corresponding to the design pattern on the polymer layer, and curing the mask pattern.

The correcting of the distorted region may include deforming the distorted region using a piezo actuator. The deforming of the distorted region may include moving the distorted region in two horizontal axes substantially perpendicular to each other using the piezo actuator. The deforming of the distorted region may further include moving the distorted region in a vertical axis using the piezo actuator.

The curing of the mask pattern may include irradiating an ultraviolet light to the mask pattern. The irradiating of the ultraviolet light may include irradiating the ultraviolet light to a side surface of the mask pattern.

According to an embodiment, there is provided an apparatus for manufacturing a mask, the apparatus including a template having a design pattern, a correcting unit that divides an upper surface of the template into a plurality of regions, the correcting unit being connected to each of the regions to selectively correct a distorted region among the regions, a pressing unit that presses a polymer layer with the template to form a mask pattern corresponding to the design pattern on the polymer layer, and a curing unit that cures the mask pattern.

The correcting unit may include a plurality of piezo actuators. Each of the piezo actuators may be connected to one of the regions of the upper surface of the template. The piezo actuators may be moveable along two horizontal axes substantially perpendicular to each other. The piezo actuators may be moveable along a vertical axis.

The curing unit may be arranged at side of the mask pattern. The curing unit may include an ultraviolet light-irradiating member that irradiates an ultraviolet light to a side surface of the mask pattern.

According to an embodiment, there is provided a method of correcting a template used to manufacture a mask, the method including arranging a template over a polymer layer on a mask substrate, the template having a design pattern and including an upper surface with a plurality of regions, and correcting one or more distorted regions among the plurality of regions of the template using a correcting unit that does not substantially affect non-distorted regions among the plurality of regions of the template.

The correcting unit may include a plurality of piezo actuators, each being connected to one region of the plurality of regions. The correcting of the one or more distorted regions may include activating only ones of the plurality of piezo actuators corresponding to the one or more distorted regions.

The correcting of the one or more distorted regions may include activating the ones of the plurality of piezo actuators corresponding to the one or more distorted regions to independently move the one or more distorted regions horizontally or vertically.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
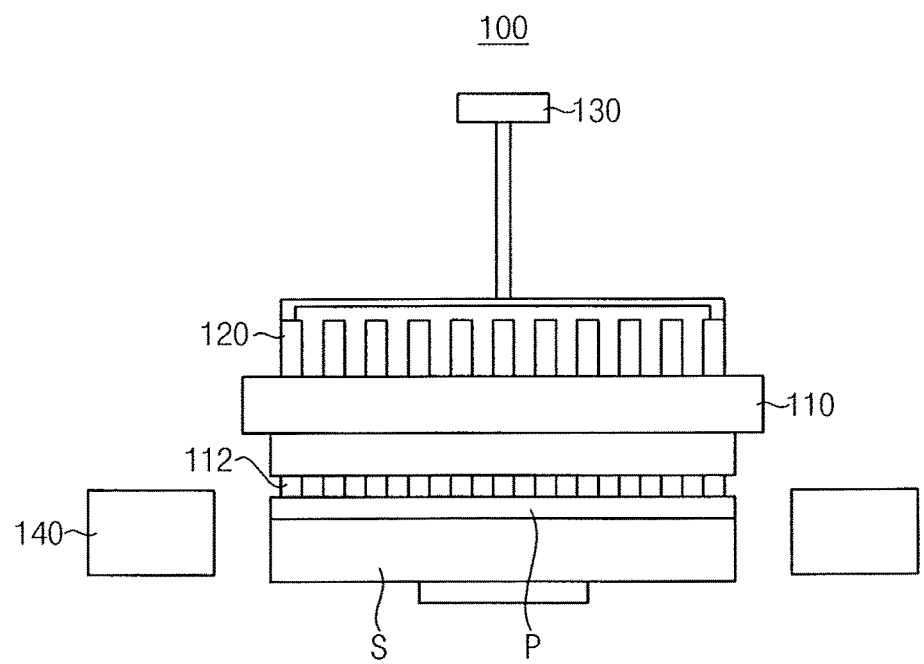
FIG. 1 illustrates a cross-sectional view relating to an apparatus for manufacturing a mask in accordance with some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

It will be understood that spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented in an "upper" disposition relative to the other elements or features. Thus, the exemplary term "lower" can encompass both an orientation of above and below. The device may be otherwise oriented (rotated 90 degrees or at other orientations) and the spatially relative descriptors used herein may be interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Apparatus for Manufacturing a Mask

Figure 2:
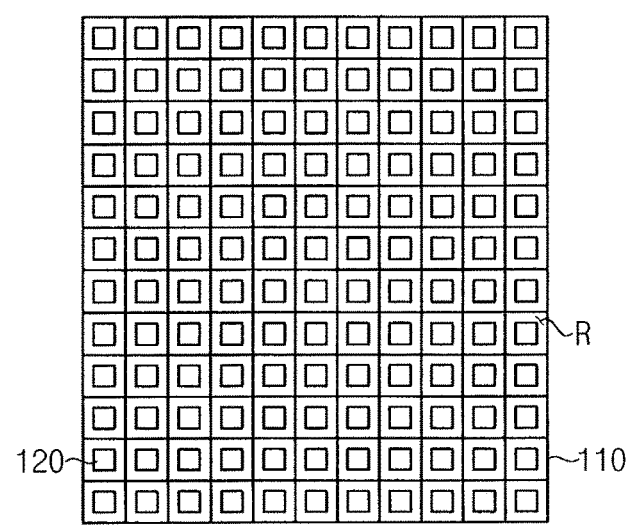
FIG. 2 illustrates a plan view relating to the apparatus in FIG. 1.

FIG. 1 is a cross-sectional view illustrating an apparatus for manufacturing a mask in accordance with some example embodiments, and FIG. 2 is a plan view illustrating the apparatus in FIG. 1.

Referring to FIG. 1, an apparatus 100 for manufacturing a mask in accordance with this example embodiment may include a template 110, a correcting unit 120, a pressing unit 130 and curing unit 140.

The template 110 may be arranged over a mask substrate S. In example embodiments, a polymer layer P may be formed on an upper surface of the mask substrate S. The template 110 may have a design pattern 112. The design pattern 112 may be formed on a lower surface of the template 110. Thus, the design pattern 112 may be oriented toward the polymer layer P.

The correcting unit 120 may be arranged on an upper surface of the template 110. As shown in FIG. 2, the correcting unit 120 may divide the upper surface of the template 110 into a plurality of regions R. The correcting unit 120 may be individually connected to each of the regions R to correct a shape of a region R having a distorted pattern.

In example embodiments, the correcting unit 120 may include a plurality of piezo actuators. The piezo actuators 120 may be connected to the regions R, respectively. Thus, the number of the regions R may be substantially the same as the number of the piezo actuators 120.

The piezo actuators 120 may directly apply a voltage to the region R having the distorted pattern to correct the distorted pattern. In example embodiments, the piezo actuators 120 may move the region R having the distorted pattern along two horizontal axes substantially perpendicular to each other, i.e., along an X-axis and a Y-axis. Further, the piezo actuators 120 may move the region R having the distorted pattern along a vertical axis, i.e., along a Z-axis. Therefore, the piezo actuators 120 may control a critical dimension and an overlay as well as the shape of the design pattern in the region R.

The pressing unit 130 may be connected to an upper surface of the correcting unit 120. The pressing unit 130 may lower the template 110 toward the polymer layer P. Thus, the template 110 may press the polymer layer P to engrave the design pattern 112 of the template 110 on the polymer layer P. A pattern on the polymer layer P may correspond to a mask pattern. After forming the mask pattern, the pressing unit 130 may raise the correcting unit 120 and the template 110 from the polymer layer P.

The curing unit 140 may cure the mask pattern. In example embodiments, the curing unit 140 may include an ultraviolet light-irradiating member that irradiates an ultraviolet light to a side surface of the mask substrate S. Because the correcting unit 120 may be arranged over the template 110, it may not be feasible to irradiate the ultraviolet light to the upper surface of the template 110. Thus, the curing unit 140 may be arranged at a side of the mask substrate S.

Method of Manufacturing a Mask

Figure 3:
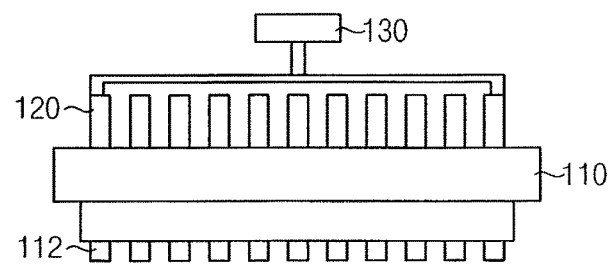
FIGS. 3 to 5 illustrate cross-sectional views relating to a method of manufacturing the mask using the apparatus in FIG. 1.
Figure 3:
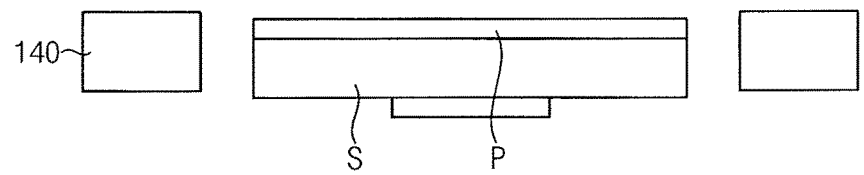
Figure 4:
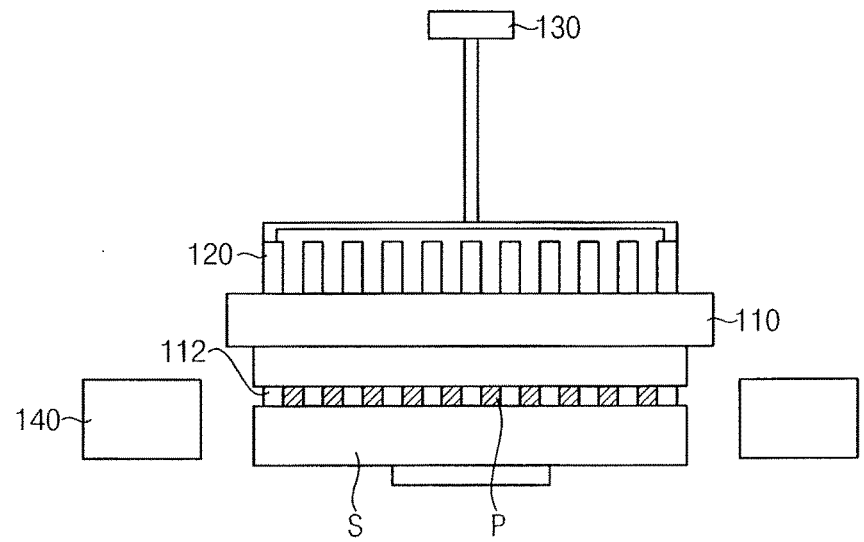
Figure 5:
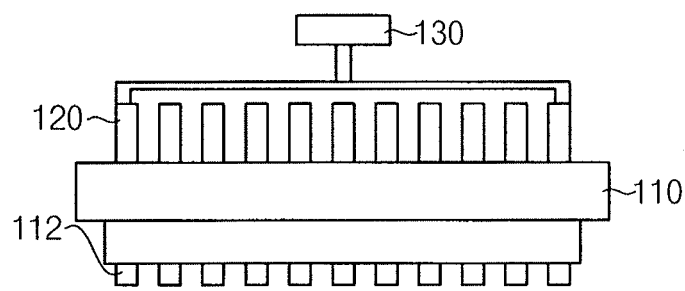
Figure 5:
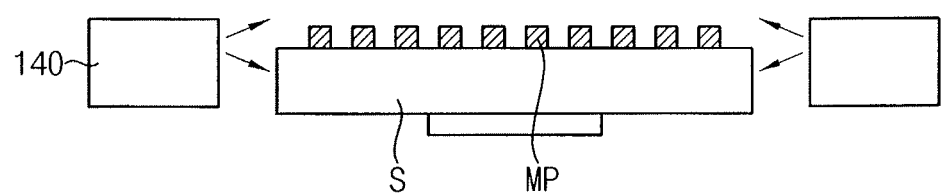

FIGS. 3 to 5 are cross-sectional views illustrating a method of manufacturing the mask using the apparatus in FIG. 1.

Referring to FIG. 3, the template 110 and the correcting unit 120 may initially be raised by the pressing unit 130. Thus, the template 110 and the correcting unit 120 may be spaced apart from the upper surface of the mask substrate S.

As shown in FIG. 2, the correcting unit 120 may divide the upper surface of the template 110 into the regions R. When the design pattern of the template 110 is distorted, a corresponding piezo actuator 120 connected to a region R having a distorted pattern may be operated to correct a shape of the distorted region R. Particularly, the piezo actuator 120 may selectively move the distorted region R along the X-axis, the Y-axis and the Z-axis to correct the distorted region R.

In example embodiments, an indirect correction of the shape of the distorted region R that affects other regions may be avoided. Only the piezo actuator 120 connected to the distorted region R may be operated to correct the shape of only the distorted region R. Thus, during the correcting of the shape of the distorted region R, deformation of other regions R having normal patterns may be avoided.

Referring to FIG. 4, after correcting the shape of the template 110, the pressing unit 130 may lower the template 110 and the correcting unit 120. Thus, the design pattern 112 of the template 110 may press the polymer layer P.

Referring to FIG. 5, the pressing unit 130 may raise the template 110 and the correcting unit 120 after the pressing of the polymer layer P. A mask pattern MP corresponding to the design pattern 112 may be formed on the polymer layer P.

The curing unit 140 may irradiate the ultraviolet light to the mask pattern MP to cure the mask pattern MP.

By way of summation and review, in a process of manufacturing a mask by transcribing a design pattern of a mask from a template into a layer, it is desirable to provide a design pattern having the desired pattern. Accuracy of the design pattern may be determined in accordance with flatness and distortion of the template. When the template has a non-flat portion and/or a partially distorted portion, the design pattern may not be accurately transcribed into the polymer layer.

Therefore, in order to correct the flatness and the distortion of the template, it is desirable to perform a process for correcting a shape of the template. For example, the shape of the template may be corrected using a piezo actuator connected to a side surface of the template.

However, the piezo actuator connected to the side surface of the template may not correct a desired portion of the template. For example, when the distorted portion is formed at a central portion of the template, the piezo actuator may move a normal edge portion of the template as well as the central portion of the template. Thus, the normal edge portion of the template may become distorted.

The example embodiments disclosed herein advance the art by dividing the upper surface of the template into regions such that only a region having a distorted portion among the regions is directly corrected. Thus, only the distorted portion may be accurately corrected. Thereafter, the design pattern may be engraved on the polymer layer, so that the mask may have a desired mask pattern.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of manufacturing a mask, the method comprising:
   dividing an upper surface of a template having a design pattern into a plurality of regions, the template being arranged over a polymer layer on a mask substrate;
   correcting a distorted region among the regions;
   pressing the polymer layer with the template to form a mask pattern corresponding to the design pattern on the polymer layer; and
   curing the mask pattern.

2. The method as claimed in claim 1, wherein the correcting of the distorted region includes deforming the distorted region using a piezo actuator.

3. The method as claimed in claim 2, wherein the deforming of the distorted region includes moving the distorted region in two horizontal axes substantially perpendicular to each other using the piezo actuator.

4. The method as claimed in claim 3, wherein the deforming of the distorted region further includes moving the distorted region in a vertical axis using the piezo actuator.

5. The method as claimed in claim 1, wherein the curing of the mask pattern includes irradiating an ultraviolet light to the mask pattern.

6. The method as claimed in claim 5, wherein the irradiating of the ultraviolet light includes irradiating the ultraviolet light to a side surface of the mask pattern.

7. A method of manufacturing a mask, the method comprising:
   arranging a template over a polymer layer on a mask substrate, the template having a design pattern and including an upper surface with a plurality of regions; and
   correcting one or more distorted regions among the plurality of regions of the template using a correcting unit that does not substantially affect non-distorted regions among the plurality of regions of the template.

8. The method as claimed in claim 7, wherein:
   the correcting unit includes a plurality of piezo actuators, each of the plurality of piezo actuators being respectively connected to one region of the plurality of regions, and
   the correcting of the one or more distorted regions includes activating only ones of the plurality of piezo actuators corresponding to the one or more distorted regions.

9. The method as claimed in claim 8, wherein the correcting of the one or more distorted regions includes activating the ones of the plurality of piezo actuators corresponding to the one or more distorted regions to independently move the one or more distorted regions horizontally or vertically.

* * * * *